(12) United States Patent
Collier et al.

(10) Patent No.: US 6,681,102 B1
(45) Date of Patent: Jan. 20, 2004

(54) ADJUSTABLE FILTER

(75) Inventors: James Digby Yarlet Collier, Ely (GB); Ian Michael Sabberton, Weston Green (GB)

(73) Assignee: Cambridge Silicon Radio Ltd., Cambridge (GB)

(*) Notice: Subject to any disclaimer, the term of this patent is extended or adjusted under 35 U.S.C. 154(b) by 279 days.

(21) Appl. No.: 09/618,637

(22) Filed: Jul. 18, 2000

(30) Foreign Application Priority Data

Jul. 19, 1999 (GB) .............................................. 9916901

(51) Int. Cl.[7] .................................................. H04B 1/10
(52) U.S. Cl. ........................ 455/296; 455/318; 455/340; 331/177 V; 331/177 R; 331/360
(58) Field of Search .............................. 331/360, 177 V, 331/177 R, 117 R, 167; 455/296, 318, 339, 340, 307, 178.1, 180.3, 180.4, 183.2, 191.1, 191.2, 193.2, 193.3, 196.1, 197.1, 197.2, 197.3

(56) References Cited

U.S. PATENT DOCUMENTS

| | | | |
|---|---|---|---|
| 4,731,877 A | * 3/1988 | Moon | ............ 455/340 |
| 5,880,643 A | 3/1999 | Björk et al. | |
| 6,125,269 A | * 9/2000 | Brekelmans | ............ 455/180.1 |
| 6,377,315 B1 | 4/2002 | Carr et al. | |
| 6,426,680 B1 | 7/2002 | Duncan et al. | |

FOREIGN PATENT DOCUMENTS

| | | | |
|---|---|---|---|
| EP | 0 206 191 A2 | 6/1986 | |
| EP | 206191 A | * 12/1986 | ............ H03J/3/32 |
| EP | 0 563 945 A1 | 10/1993 | |
| EP | 0 951 147 A1 | 10/1999 | |

* cited by examiner

Primary Examiner—William Trost
Assistant Examiner—Sharad Rampuria
(74) Attorney, Agent, or Firm—Rothwell, Figg, Ernst & Manbeck

(57) ABSTRACT

A radio transmitter and/or receiver comprising: an oscillator tuning circuit comprising an adjustable capacitor whose capacitance is adjustable by means of a first tuning signal; a filter tuning circuit comprising an adjustable capacitor whose capacitance is adjustable by means of a second tuning signal; an oscillator whose operational frequency is dependant on the reactance of the oscillator tuning circuit; a filter for filtering signals in the course of transmission and/or reception, and whose response is dependant on the reactance of the filter tuning circuit; and a tuning unit for generating the first and second tuning signals; wherein at least a part of the filter tuning circuit is a replica of at least a part of the oscillator tuning circuit and the tuning circuit is capable of generating one of the first and second tuning signals in dependence on the other of the tuning signals.

16 Claims, 2 Drawing Sheets

ADJUSTABLE FILTER

FIELD OF THE INVENTION

This Invention relates to the adjustment of filters, especially in ways that can address manufacturing variations. The filters may be usable in transceivers for transmitting and/or receiving radio signals.

BACKGROUND OF THE INVENTION

FIG. 1 shows schematically the structure of one example of a radio transceiver. The transceiver has an antenna 1 and a signal processing unit 2 for baseband processing of received signals and signals that are to be transmitted. Between the antenna and the signal processing unit are a receive chain 3 and a transmit chain 4, which are connected to the antenna 1 by a duplexer 5. The receive chain 3 converts received radio frequency (RF) signals down to baseband for further processing by the signal processing unit 2. The transmit chain 4 converts signals from baseband to AS for transmission from the antenna 1. The receive chain comprises an input emplifier 7 which amplifies the received signal, a mixer 8 which mixes the amplified signals with a signal from oscillator 9 to convert to Intermediate frequency (IF), and a mixer 10 which mixes the IF signal with a signal from oscillator 11 to convert to baseband. Between each of the units 7, 8, 10 and 2 is a bandpass filter 12, 13, 14 to remove off-band interference and image frequencies. The transmit chain comprises a mixer 17 which mixes the baseband signals with a signal from oscillator 18 to upconvert to RF and an output amplifier 19 which amplifies the RF signals for transmission. Filters 20, 21, 22 can also be included in the transmit chain.

In many applications it would be desirable, in order to reduce size and cost, to implement the entire transceiver, or at least the receive and transmit chains on a single integrated circuit (IC) One particular difficulty in designing such an IC is the implementation of the filters and the oscillators, and especially of circuitry intended for setting the operational frequencies of those components. In many implementations of transceiver circuits the components of the filters (especially the RF filters 12, 20, 21) are implemented by passive components rather than as active filters. Often these are provided as discrete off-chip components such as capacitors, inductors and ceramic or SAW (surface acoustic wave) filters even if the remainder of the transmit and receive chains is implemented on a single integrated circuit.

The approach of Implementing fitters by means of discrete components generally provides filters that have superior response, noise or linearity characteristics. However, there is a need to adjust such filters after manufacturing in order to tune them to the desired frequency response. For this reason adjustable discrete components such as trimmer capacitors are generally also provided to allow the filters to be tuned to the desired frequency response. This approach has a number of disadvantages. First, during manufacturing the fitting of the discrete components requires additional processing steps. Second, the discrete components demand additional space in the radio device, increasing Its overall size. Third, additional time and additional processing stations are needed to adjust the filters mechanically to the desired response during the manufacturing process, In several situations there is correspondence between adjustment desired to be made to an oscillator of the transceiver (e.g. oscillator 18) and a filter of the transceiver (e.g. filter 20) This can arise because (i) when a channel is selected for transmission and reception the filter and the oscillator may have to be adjusted correspondingly so that the pass band of the filter and the oscillation frequency of the oscillator are the same or related by simple algebraic expressions and (ii) because when the filter and the oscillator are on the same integrated circuit they are likely to be subject to similar systematic errors due to environmental factors.

It would be desirable to employ a filter that has the generally superior characteristics of a filter formed from discrete components but that can be implemented on chip, and that could be adjusted efficiently

SUMMARY OF THE INVENTION

According to the present invention there is provided a radio transmitter and/or receiver comprising: an oscillator tuning circuit comprising an adjustable capacitor whose capacitance is adjustable by means of a first tuning signal; a filter tuning circuit comprising an adjustable capacitor whose capacitance is adjustable by means of a second tuning signal; an oscillator whose operational frequency is dependent on the reactance of th e oscillator tuning circuit; a filter for filtering signals in the course of transmission and/or reception, and whose response is dependant on the reactance of the filter tuning circuit; and a tuning unit for generating the first and second tuning signals, wherein at least a part of the filter tuning circuit is a replica of at least a part of the oscillator tuning circuit and the tuning circuit is capable of generating one of the first and second tuning signals in dependence on the other of the tuning signals.

The said part of the oscillator tuning circuit suitably comprises a plurality of selectively engageable reactive elements on which the reactance of the filter tuning circuit is dependent. The reactive elements may be capacitors or inductors. The reactive elements are preferably discrete components. The reactive elements are preferably formed on a single integrated circuit.

The said part of the filter tuning circuit suitably comprises a plurality of selectively engageable reactive elements on which the reactance of the filter tuning circuit is dependent. The reactive elements may be capacitors or inductors The reactive elements are preferably discrete components. The reactive elements are preferably formed on a single integrated circuit. The said part of the filter tuning circuit preferably comprises a plurality of reactive elements each corresponding to a reactive element of the oscillator tuning circuit.

Most preferably the reactive elements of the said part of the filter tuning circuit are nominally of a common scale with respect to the corresponding elements of the said part of the oscillator tuning circuit The reactive elements of the said part of the filter tuning circuit may be nominally identical to the corresponding elements of the said part of the oscillator tuning circuit. The said reactive elements of the said part of the filter tuning circuit are nominally scaled as an integer multiple of the corresponding elements of the said part of the oscillator tuning circuit. The said reactive elements of the said part of the oscillator tuning circuit may be nominally scaled as an integer multiple of the corresponding components of the said part of the filter tuning circuit. The scaling may be in size, nominal value or actual value.

Each of the said reactive elements of the oscillator tuning circuit may be selectively engageable by a respective oscillator tuning switch means (e.g a transistor or other preferably electrically actuable switch) connected in series with it Preferably each of the said oscillator tuning switch means is responsive to a digital component of the second tuning signal. Preferably each of the said reactive elements of the filter tuning circuit is selectively engageable by a respective filter tuning switch means connected in series with it. Each of the said filter tuning switch means is suitably responsive to a digital component of the first tuning signal. The first and second tuning signals may be provided on a plurality of individual digital lines. The first and second tuning signals may each comprise a plurality of digital signal components.

Preferably the operational frequency of the oscillator is an integer multiple or fraction of the frequency that lies in or near the pass band of the filter.

Most preferably the filter tuning circuit and the oscillator tuning circuit are formed on a single Integrated circuit.

The filter is suitably part of a radio receiver unit of the transceiver, which is preferably a zero or near zero intermediate frequency receiver unit. The filter may be a passive filter. The oscillator may be a local oscillator for the transmitter and/or receiver.

BRIEF DESCRIPTION OF THE DRAWINGS

The present invention will now be described by way of example with reference to the accompanying drawings, in which.

DESCRIPTION OF THE PREFERRED EMBODIMENTS

Figure 1:
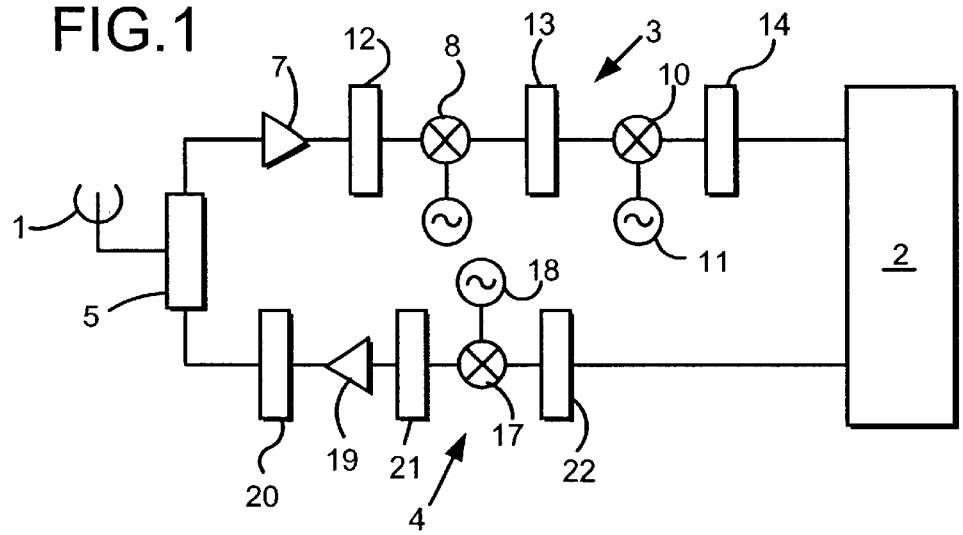
Figure 2:
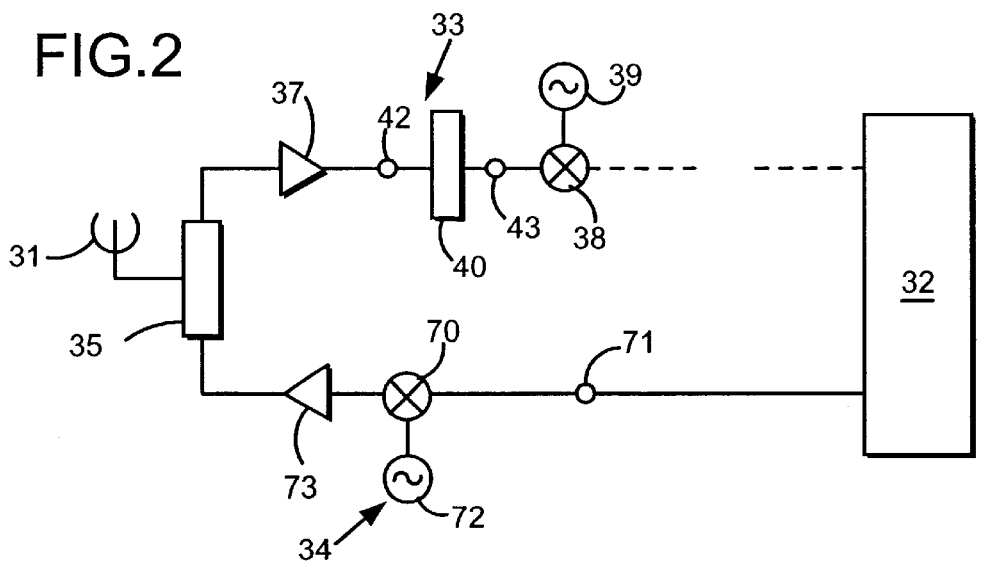
FIG. 2 shows a schematic drawing of a radio transceiver.

FIG. 2 shows part of a transceiver circuit having an antenna 31 and a signal processing unit 32 for baseband processing of received signals and signals that are to be transmitted. Between the antenna and the signal processing unit are a receive chain 33 and a transmit chain 34, which are connected to the antenna I by a duplexer 35. The antenna, signal processing unit and duplexer 35 are similar to those of FIG. 1. As in the system of FIG. 1 the receive chain 33 converts received radio frequency (RF) signals down to baseband for further processing by the signal processing unit 32, and the transmit chain 34 converts signals from baseband to RF for transmission from the antenna 31.

The receive chain comprises an input amplifier 37 which amplifies the received signal and a mixer 38 which mixes the amplified signals with a signal from oscillator 39. A bandpass filter 40 is located between the amplifier 37 and the mixer 38. The bandpass filter is intended only to pass signals at or very near the frequency of the RF signals that are to be received. The pass band of the filter is relatively narrow. It is therefore necessary that it can be tuned very accurately to the desired frequency. The desired frequency range may also change during use, for example to receive on a different radio frequency channel. In addition it is necessary that any frequency drift due, for example, to temperature variations altering the characteristics of the filters components, can be corrected for or accommodated. Furthermore, it is likely that the actual values of the filters components will vary from transceiver to transceiver within a nominal tolerance, and the filter must be capable of being adjusted to nevertheless achieve the desired response.

Figure 3:
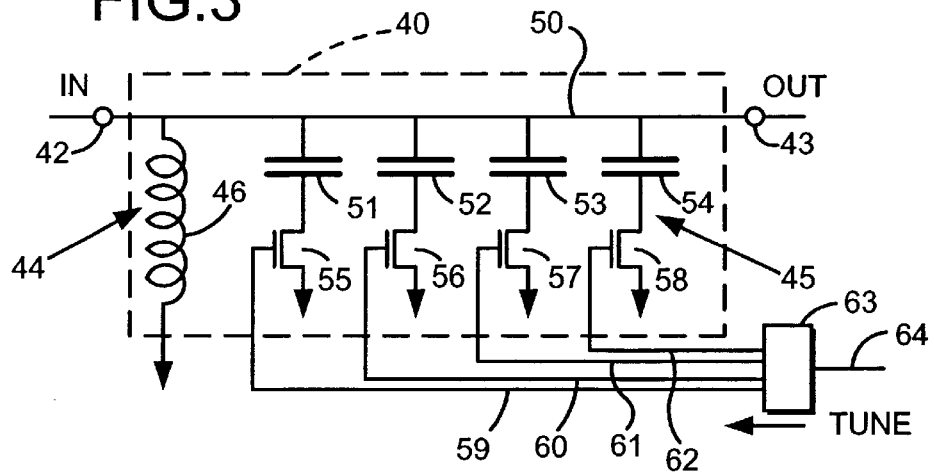
FIG. 3 shows an adjustable filter.

FIG. 3 shows in more detail one simple example of a structure for the passive filter 40. The filter comprises an inductive limb 44 and a capacitative limb shown generally at 45 connected in parallel between a node 50 (which runs from input node 42 to output node 43) and signal ground. The inductive limb 44 of the filter is provided by an inductance 46. The capacitative limb is provided by a discretely variable capacitative structure. The capacitative structure comprises one or more capacitors (in this case four capacitors 51–54) arranged in parallel between the node 50 and the signal ground. In series with each of the capacitors is a respective transistor switch 55–58 connected with its drain to the corresponding capacitor and its source to the signal ground Each of the switching transistors is actuable by a respective tuning signal 59–62 to its gate to change the impedance between its drain and source and thereby couple the respective capacitor to the signal ground. Thus the total capacitance of the capacitative limb can be digitally adjusted by means of the input lines 59–62. In this way the resonant response of the overall filter can be adjusted digitally. There may in addition be one or more capacitors fixedly coupled between node 50 and the signal ground. The capacitance of the capacitative limb is highest when all of the capacitances in the variable capacitative structure are switched in and lowest when all but the lowest switchable capacitor is switched out (or, In an embodiment in which a fixed path between node 50 and the signal ground is available, when all are switched out).

The filter behaves as a parallel LC filter, and its response is dependant on the total capacitance of the capacitative limb. The response of the filter can therefore be adjusted by means of the tuning signals on lines 59–62. A control unit 63 generates the tuning signals, and adjusts the response of the filter to the desired state. The Individual tuning signals together represent a single overall tuning signal. The control unit 63 operates in response to a signal received at 64 which indicates whether an increase or decrease in the frequencies of the filters response characteristics is needed. The signal 64 may be received from an overall control processor and/or from a feedback circuit.

It should be noted that the values of the capacitative and inductive components in the filter are selected so that they allow variation of the falter's response as sensitively as possible about the expected frequency range of the filter's pass band. One particular way to achieve this is by careful selection of any fixed capacitative structure, and the provision of capacitors of sufficiently small values, or of a range of values, In this embodiment digital signals are applied to the input lines 59–62, so that each switching transistor 55–58 is either fully on or fully off. Thus the transistor switching is essentially binary.

In a mass-produced transceiver it will be expected that there will be some variation in the real values of the inductive and capacitative components from one transceiver to the next, even if they have the same nominal values. If the transceiver is formed on an integrated circuit then typical variations are: ±30% for resistors, ±10% for capacitors and ±7% for inductors; the values also being dependant on temperature. Therefore the same setting of the input lines 59–62 may not yield the same response in two nominally identical transceivers. The control apparatus 63, which can fix each input line 59–62 either high or low in order to achieve the desired response from filter 40, receives an input 64 and generates a digital output for each input line 59–61 accordingly. The operation of the control unit will be described in more detail below.

The filter 40 and control apparatus 63 can be implemented on a single integrated circuit. This approach offers a substantial size and cost reduction over prior designs using off-chip filter components. The control unit 63 allows the filter's response to be adjusted electronically rather than mechanically, saving time during manufacturing and allowing the possibility of the filter being adjusted on startup of the transceiver or even during use in order to accommodate, for Instance, temperature variations.

The transmit chain shown in FIG. 2 includes a mixer 70 which receives baseband signals at 71 and upconverts them to RF by mixing with an RF input from oscillator 72. The RF signals are then amplified by amplifier 73 before transmission.

Figure 4:
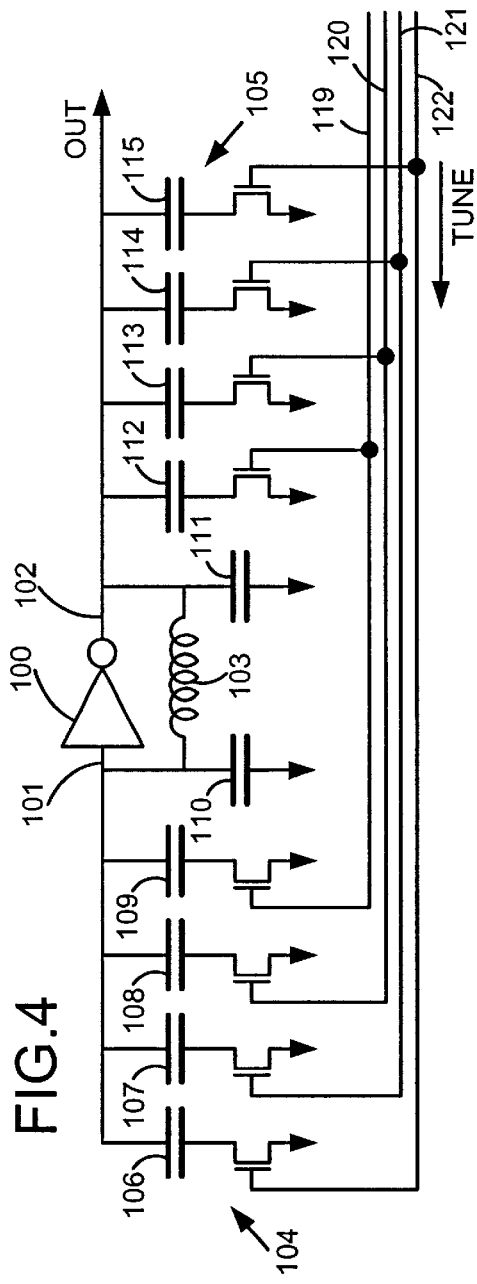
FIG. 4 shows an adjustable oscillator.

FIG. 4 shows in more detail one simple example of a structure for the oscillator 39. The oscillator circuit comprises transconductance stage 100 whose input 101 and output 102 are connected by inductor 103. The input 101 and output 102 are also each connected to signal ground by a respective capacitative structure 104, 105. Each capecitative structure comprises a series of capacitors 106–115 arranged In parallel between the Input or output 101/102 and the low voltage. All but one of the capacitors of each structure is in series with a respective switching transistor by means of which the respective capacitor can be connected between the input/output and the signal ground in an analogous way to the operation of the capacitative section of the filter of FIG. 3. One of the capacitors of each structure (capacitors 110, 111) is fixedly connected between the input/output and the low voltage Each capacitor has a counterpart of nominally equal capacitance in the opposite capacitative structure. Thus in the following pairs both capacitors have nominally equal values: 106/111, 107/114, 108/113, 109/112, 110/111. The transistors corresponding to the paired non-fixed capacitors are actuable by a common tuning signal on lines 119–122. When the oscillator is formed on a single IC will be expected that these values are exactly equal.

The oscillation frequency of the oscillator is discretely variable by means of the tuning signals on lines 119–122. In this embodiment digital signals are applied to the input lines 119–122, so that each switching transistor is either fully on or fully off.

The oscillator 39 could be controlled by its own control apparatus. However, it is preferred that it is controlled by the same control apparatus 63 as is used to control the filter 40. It is most preferred that the capacitor arrays 51–54, 106–109 and 115–112 are substantially the same or are related In value in a known way. Then similar signals can be used to control the respective switching transistors via switching lines 59–62 and 119–122 to achieve a common effect on the operating frequencies of filter 40 and oscillator 72 as will be described in more detail below.

In one preferred embodiment the filter 40 and the oscillator 39 are formed on me same integrated circuit, with each of the capacitors of their respective capacitor arrays being nominally the same as the corresponding capacitor In the other arrays. For example, the corresponding capacitors may be formed on the integrated circuit with the same dimensions and materials and under the same manufacturing process. Then, although the actual value of each capacitor might vary significantly from Its nominal value due to inaccuracies in the process of manufacturing the integrated circuit, it is likely that the actual values of the corresponding capacitors will be very similar because both have been subject to the same manufacturing parameters. Therefore, the actual values of the corresponding capacitors in the arrays are likely to be very similar.

In many situations there will be a known relationship that is desired between the operating frequency of the filter and the oscillator—for example the frequency of the oscillator may be desired to be the same as the centre pass frequency of the filter, or one may be desired to be a known multiple (e.g. an integer multiple) of the other. When the variable capacitive components of the filter and the oscillator can be assumed to have essentially the same values, the circuits can be arranged so that the same control signals can be used to control each of those components and thereby adjust the operating frequencies of both the filter 40 and the oscillator 72 whilst maintaining a known relationship between the two. That relationship is dependent on the values of the fixed inductive and capacitative components in the filter and oscillator circuits. Therefore, in that embodiment the lines 59–62 and 119–122 may be connected respectively together, so that lines 59 and 119 give the same signal, lines 60 and 120 give the same signal; lines 61 and 121 give the same signal and lines 62 and 122 give the same signal. When the signals are scaled relative to each other this may be achieved by digital processing (e.g. simple shifting of the bit significance) of individual tuning signals.

The filter and the oscillator may be arranged so that they are not intended to receive common tuning Input signals In the manner described above. However, It is preferred that they are designed to receive tuning signals that are of a fixed relationship to each other, for example by one tuning signal being derived from the other.

In other embodiments the values of the capacative components could be different. Preferably, each capacitor of the filter is scaled commonly to the respective capacitor of the oscillator, most preferably with each capacitor of the filter having a value that is an integer multiple of the value of its counterparts in the oscillator, or me capacitors in the oscillator having a value that is an integer multiple of their counterpart in the filter. When the multiple is an integer multiple, for example 2, 3, 4, or 5 it is easier to ensure common scaling of the capacitors, for instance by forming a larger capacitance from a number of smaller capacitors.

A potential advantage of all these arrangements is that there is no need to control the filter and the oscillator separately. Because the behaviour of the filter and the oscillator is linked in a known way by the relationship between their designs and components a single tuning arrangement can be used.

In order for the tuning signals to the filter and the oscillator to be conveniently related a number of measures may be adopted. The overall design of the filter and the oscillator, and the values of the fixed and variable components of the filter and the oscillator are preferably chosen so that the available adjustment of the circuits of the filter and oscillator produce the desired related alteration of their characteristics. Also, it is preferred that operational frequency of the oscillator is an integer multiple of a frequency that lies in or near the pass band of the filter.

A number of ways are available to derive the control signals for trimming the filter 40 and the oscillator 39 to control their operating frequencies. The trimming could be done at the manufacture stage, each time the transceiver is switched on or continuously or periodically during use. Since each trimming capacitance is switched fully into or out of the circuit the trimming is a digital operation. The setting of the switching transistors can be represented as a binary number with one digit corresponding to the switching input to each switching transistor. The setting of the trimming capacitors can therefore be stored digitally by memory of the radio terminal during manufacture or use and reproduced exactly when required by recalling the appropriate setting from memory. More than one setting could be stored (either at manufacture or during use) for different applications, such as different operating frequencies or temperatures.

Figure 5:
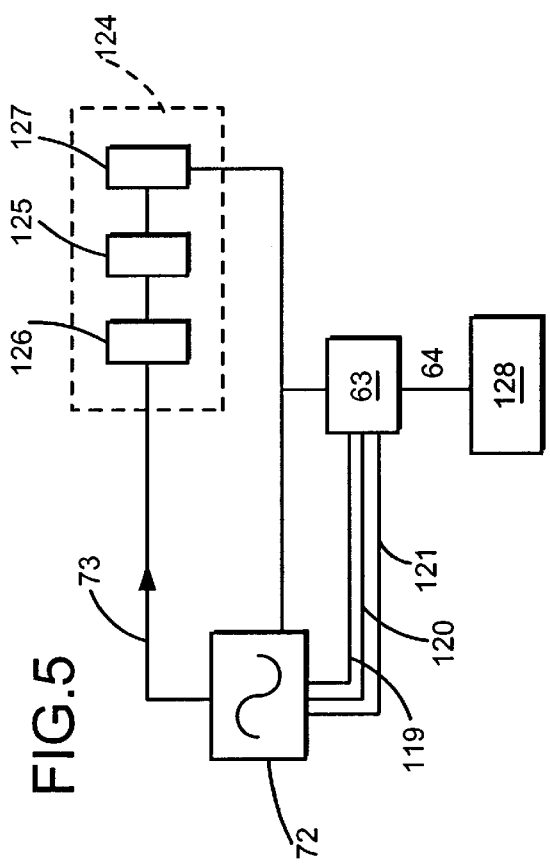
FIG. 5 shows an oscillator control circuit.

FIG. 5 shows one preferred arrangement for controlling the oscillator 39 and, by means of common inputs to its switching transistors, the filter 40. The output of the oscillator 39 passes to a PLL 124 comprising a divider 126, a phase detector 125 and a loop filter 127. These could feed back to an input of the oscillator and/or to the oscillator control unit 63. The switching inputs 119–121 etc. of the oscillator are driven from an oscillator control unit 63. The control unit is under the supervision of a main processor 128 of the radio terminal. The control unit 63 monitors the voltage at input 101. The control unit adjusts the switching of the trimming capacitors with the aim that the voltage at 101 is as close as possible to a set value.

Figure 6:
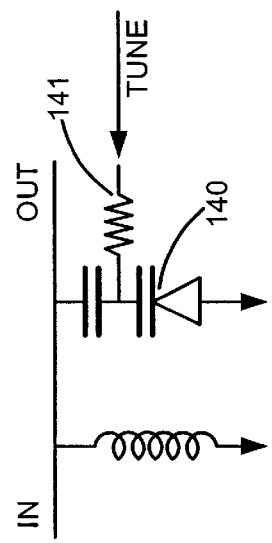
FIG. 6 shows an alternative adjustable filter.

In the embodiments shown in FIGS. 3 to 5, the filter and oscillator are discretely variable by means of digital tuning signals. The use of digital tuning signals is preferred because digital control signals are easily generated by digital control circuitry, discrete circuits such as the capacitor arrays of FIGS. 3 and 4 are readily arranged to have similar and/or nominally identical values, and because a set of digital control signals can readily be stored in a memory of the control; processor 63 for recall and re-use when required. However, It is possible for common analogue tuning signals to be used. For example, FIG. 6 illustrates one example of a filter circuit analogous to that of FIG. 3 in which the capacitative limb includes a varicap diode 140 that can be adjusted by an analogue signal on line 141 to alter the response of the filter. A similar arrangement In can be used for the variable capacitance(s) of a corresponding oscillator.

Each of the arrays of capacitors may include any number of capacitors from two upwards, or from one upwards if there is a fixed capacitor in parallel too. The values of the trimming capacitors in a single array could be the same or different. If the values of the trimming capacitors are different then the same number of trimming capacitors can be used to allow trimming over a wider range. The trimming capacitors could suitably provide 128 equal steps of total capacitance. This could, for instance, be achieved by 128 capacitors of the same value, or 7 adjusted as precisely as the oscillator. In that case in the tuning circuit for the fitter the equivalent capacitors to the smallest (least significant) capacitors of the tuning circuit for the oscillator could be omitted.

The radio terminal could be a radio transmitter and/or receiver. The terminal could operate according to any suitable scheme, including TDMA (time division multiple access) and FHSS (frequency hopped spread spectrum). The oscillator could be used in other applications such as tone generation.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

What is claimed is:

1. A radio transmitter and/or receiver, comprising:
    an oscillator tuning circuit including an adjustable capacitor whose capacitance is adjustable in accordance with a first tuning signal;
    a filter tuning circuit including an adjustable capacitor whose capacitance is adjustable in accordance with a second tuning signal;
    an oscillator whose operational frequency is dependent on the reactance of the oscillator tuning circuit;
    a filter for filtering signals in the course of transmission and/or reception, and whose response is dependent on the reactance of the filter tuning circuit; and
    a tuning unit for generating the first and second tuning signals, wherein at least a part of the filter tuning circuit is a replica of a plurality of selectively engageable reactive elements of the oscillator tuning circuit on which the reactance of the oscillator tuning circuit is dependent, and the tuning unit is capable of generating one of the first and second tuning signals from the other of the first and second tuning signals, and wherein each of the reactive elements of the oscillator tuning circuit is selectively engageable by a respective oscillator tuning switch connected in series therewith.

2. A radio transmitter and/or receiver as claimed in claim 1, wherein the said reactive elements are capacitors.

3. A radio transmitter and/or receiver as claimed in claim 1, wherein the said part of the filter tuning circuit comprises a plurality of reactive elements each corresponding to a reactive element of the oscillator tuning circuit.

4. A radio transmitter and/or receiver as claimed in claim 3, wherein the reactive elements of the said part of the filter tuning circuit are nominally identical to the corresponding elements of the said part of the oscillator tuning circuit.

5. A radio transmitter and/or receiver as claimed in claims 3, wherein the said reactive elements of the said part of the filter tuning circuit are nominally scaled as an integer multiple of the corresponding elements of the said part of the oscillator tuning circuit.

6. A radio transmitter and/or receiver as claimed in claim 3, wherein the said reactive elements of the said part of the oscillator tuning circuit are nominally scaled as an integer multiple of the corresponding components of the said part of the filter tuning circuit.

7. A radio transmitter and/or receiver as claimed in claim 1, wherein each of the said oscillator tuning switch means is responsive to a digital component of the second tuning signal.

8. A radio transmitter and/or receiver as claimed in claim 3, wherein each of the said reactive elements of the filter tuning circuit is selectively engageable by a respective filter tuning switch connected in series therewith.

9. A radio transmitter and/or receiver as claimed in claim 1, wherein each of the said filter tuning switches is responsive to a digital component of the first tuning signal.

10. A radio transmitter and/or receiver as claimed in claim 1, wherein the operational frequency of the oscillator is an integer multiple or fraction of a frequency that lies in or near the pass band of the filter.

11. A radio transmitter and/or receiver as claimed in claim 1, wherein the filter tuning circuit and the oscillator tuning circuit are formed on a single integrated circuit.

12. A radio transmitter and/or receiver as claimed in claim 1, wherein the first and second tuning signals each comprise a plurality of digital signals.

13. A radio transmitter and/or receiver as claimed in claim 1, wherein the filter is part of a zero or near zero Intermediate frequency radio receiver unit.

14. A radio transmitter and/or receiver as claimed in claim 1, wherein the filter is a passive filter.

15. A radio transmitter and/or receiver as claimed in claim 1, wherein the oscillator is a local oscillator for the transmitter and/or receiver.

16. A radio transmitter and/or receiver as claimed in claim 1, wherein the tuning signals are derived from monitoring the voltage in a phase locked loop which has the oscillator as one of its two inputs.

* * * * *